United States Patent
Fujisawa et al.

(10) Patent No.: US 11,784,069 B2
(45) Date of Patent: *Oct. 10, 2023

(54) RESIN MOLDING APPARATUS

(71) Applicant: APIC YAMADA CORPORATION, Nagano (JP)

(72) Inventors: Masahiko Fujisawa, Nagano (JP); Hirofumi Saito, Nagano (JP)

(73) Assignee: APIC YAMADA CORPORATION, Nagano (JP)

( * ) Notice: Subject to any disclaimer, the term of this patent is extended or adjusted under 35 U.S.C. 154(b) by 6 days.

This patent is subject to a terminal disclaimer.

(21) Appl. No.: 17/242,318

(22) Filed: Apr. 28, 2021

(65) Prior Publication Data

US 2021/0335632 A1  Oct. 28, 2021

(30) Foreign Application Priority Data

Apr. 28, 2020  (JP) .................................. 2020-079456

(51) Int. Cl.
*H01L 21/67* (2006.01)
*B29C 43/18* (2006.01)
(Continued)

(52) U.S. Cl.
CPC ........ *H01L 21/67126* (2013.01); *B29C 43/18* (2013.01); *B29C 43/34* (2013.01);
(Continued)

(58) Field of Classification Search
None
See application file for complete search history.

(56) References Cited

U.S. PATENT DOCUMENTS

2017/0113322 A1* 4/2017 Akita ..................... B24B 53/062
2020/0227281 A1* 7/2020 Cheng ................. H01L 21/6715
(Continued)

FOREIGN PATENT DOCUMENTS

CN      1254857      5/2006
JP      H1092850     4/1998
(Continued)

OTHER PUBLICATIONS

Machine translation of Kameyama (JP 2018022730 ) (Year: 2018).*
(Continued)

*Primary Examiner* — Robert J Grun
(74) *Attorney, Agent, or Firm* — JCIPRNET

(57) ABSTRACT

To provide a resin molding apparatus capable of correcting the bending of a workpiece during preheating or the like, improving production efficiency, and preventing the occurrence of defective products. A resin molding apparatus according to the present invention includes: a molding die which performs resin molding of a workpiece W having an electronic component mounted inside a carrier; and a loader which transports the workpiece, the loader includes a frame body which comes into contact with and separates from an outer edge portion of an upper surface of the workpiece, a moving device which moves the frame body up and down, and a chuck claw which comes into contact with an outer edge portion of a lower surface of the workpiece, and the frame body includes a contact portion which is provided over the entire circumference of the outer edge portion in the upper surface of the workpiece.

9 Claims, 3 Drawing Sheets

(51) Int. Cl.
*B29C 43/58* (2006.01)
*B29C 43/36* (2006.01)
*B29C 43/52* (2006.01)
*B29C 43/34* (2006.01)
*B29L 31/34* (2006.01)

(52) U.S. Cl.
CPC .............. *B29C 43/36* (2013.01); *B29C 43/52* (2013.01); *B29C 43/58* (2013.01); *B29C 2043/3405* (2013.01); *B29C 2043/5808* (2013.01); *B29C 2043/5833* (2013.01); *B29L 2031/34* (2013.01)

(56) References Cited

U.S. PATENT DOCUMENTS

2021/0335633 A1* 10/2021 Fujisawa .................. B29C 43/34
2021/0362382 A1* 11/2021 Fujisawa .................. B29C 43/58

FOREIGN PATENT DOCUMENTS

| JP | H10235674 | 9/1998 |
| JP | 2002100645 | 4/2002 |
| JP | 2003133345 | 5/2003 |
| JP | 2007320222 | 12/2007 |
| JP | 2009010084 | 1/2009 |

OTHER PUBLICATIONS

"Office Action of Taiwan Counterpart Application", dated Dec. 9, 2021, with English translation thereof, p. 1-p. 14.
"Office Action of Japan Counterpart Application", dated Jan. 31, 2023, with English translation thereof, pp. 1-7.

* cited by examiner

# RESIN MOLDING APPARATUS

CROSS-REFERENCE TO RELATED APPLICATIONS

This application claims the priority benefit of Japanese Patent Application No. 2020-079456, filed on Apr. 28, 2020. The entirety of the above-mentioned patent application is hereby incorporated by reference herein and made a part of this specification.

BACKGROUND

Technical Field

The present invention relates to a resin molding apparatus that molds a workpiece with a resin.

Description of Related Art

Regarding the production of semiconductor devices, resin molding apparatuses that mold a workpiece with electronic components mounted on carriers with a molding resin and process them into molded products are widely used. As an example of such resin molding apparatuses, a compression molding apparatus or a transfer molding apparatus is known.

As an example of the related art, a transfer molding apparatus for resin-molding a workpiece (lead frame) is disclosed in Patent Document 1 (Japanese Patent Application Laid-Open (JP-A) No. 10-235674). In this resin molding apparatus, when a workpiece is put into a molding die that has been heated to a predetermined temperature, heat is taken from the heated molding die into the workpiece and thus a phenomenon that the temperature of a workpiece placement portion and its surroundings drops occurs. As a result, a problem that molding defects (unfilled, voids, or the like) in the molded resin due to insufficient heat are likely to occur arises. In order to solve such a problem, the resin molding apparatus described in Patent Document 1 is provided with a preheating unit which preheats (previously heats) the workpiece to be put into the molding die.

PATENT DOCUMENTS

Patent Document 1: Japanese Patent Application Laid-Open (JP-A) No. 10-235674

In recent years, there have been an increasing number of cases in which thinner and larger carriers than the conventional one are used for the purpose of improving productivity and molding quality as carriers constituting workpieces. For that reason, a workpiece tends to bend (sometimes referred to as a "smile curve") when the workpiece is transported while holding the outer periphery and a problem occurs due to this bending.

For example, when a bent workpiece is preheated while being placed on a preheating unit (preheat stage), a non-uniform heated state occurs since there are regions in contact and not in contact with the stage, which causes molding defects in the molded resin. Further, since the heating efficiency is poor due to the regions not in contact with the preheat stage, the heating time increases. Further, if a thin and brittle carrier is suddenly pressed against the preheat stage, the carrier may be damaged.

SUMMARY

The present invention has been made in view of the above-described circumstances and an objective thereof is to provide a resin molding apparatus capable of correcting the bending of a workpiece during preheating or the like, improving production efficiency, and preventing the occurrence of molding defects.

The present invention solves the above-described problems by the solving means described below as an embodiment.

A resin molding apparatus according to the present invention includes: a molding die which performs resin molding of a workpiece having an electronic component mounted inside a carrier; and a loader which transports the workpiece, wherein the loader includes a frame body which comes into contact with and separates from an outer edge portion of an upper surface of the workpiece, a moving device which moves the frame body up and down, and a chuck claw which comes into contact with an outer edge portion of a lower surface of the workpiece, and wherein the frame body includes a contact portion which is provided over the entire circumference of the outer edge portion in the upper surface of the workpiece.

DESCRIPTION OF THE EMBODIMENTS

Figure 1:
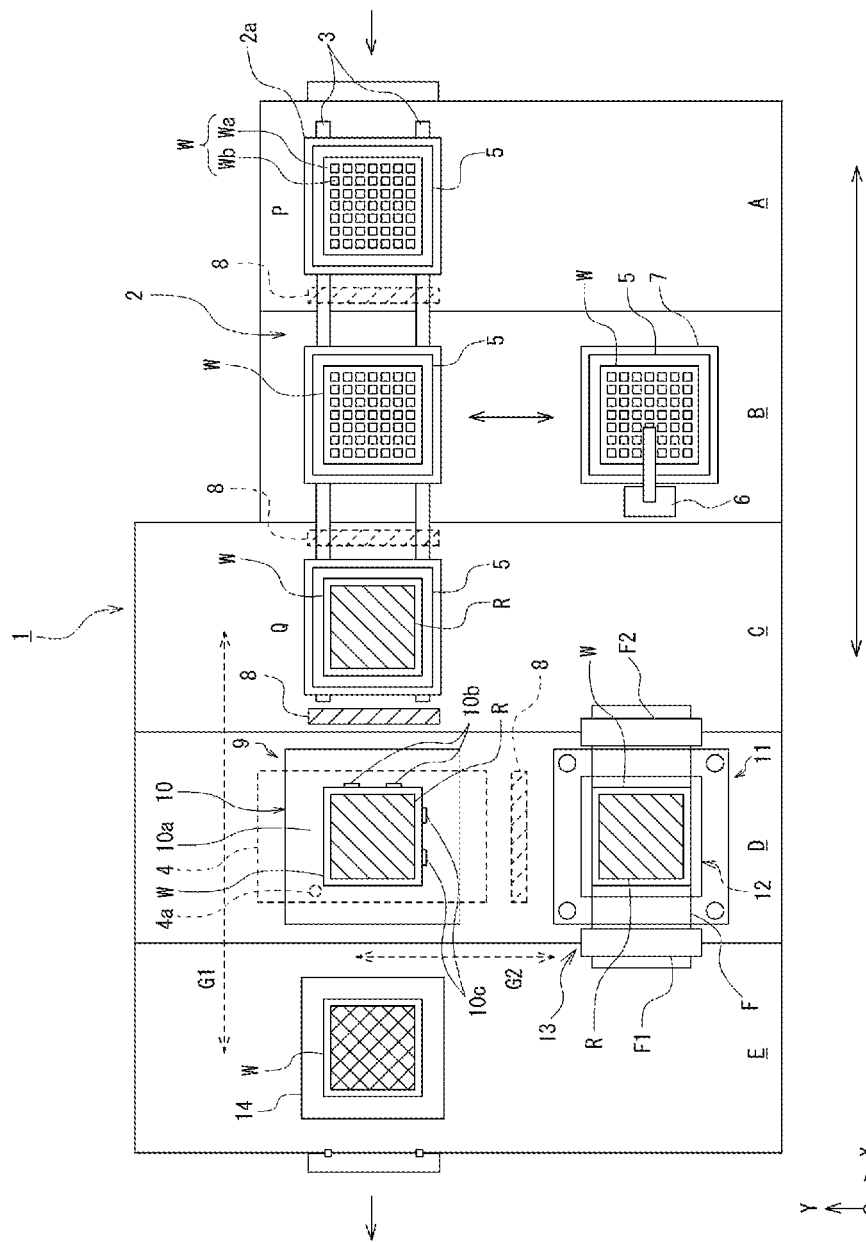
FIG. 1 is an apparatus configuration diagram showing an example of a resin molding apparatus according to an embodiment of the present invention.

Hereinafter, an embodiment of the present invention will be described in detail with reference to the drawings. FIG. 1 is a schematic view showing a configuration example of a resin molding apparatus 1 according to an embodiment of the present invention. In all drawings for describing embodiments, members having the same functions are denoted by the same reference numerals and repetitive description thereof is omitted.

A resin molding apparatus 1 according to this embodiment is an apparatus that performs resin molding of a workpiece W by using a molding die 12 including an upper die and a lower die. Hereinafter, a case of a compression molding apparatus having a cavity in the upper die will be described as an example of the resin molding apparatus 1.

First, as an example of the workpiece W to be molded, one in which an electronic component Wb such as a semiconductor chip held on a carrier Wa such as a carrier plate is used. As a main example, a rectangular carrier Wa having vertical and horizontal sides of about 500 mm to 600 mm is used. Appropriate materials such as a metal (copper alloys, stainless steels alloys, or the like) and glass are used for the carrier Wa, but one thin enough to bend under its own weight is used. A plurality of the electronic components Wb are attached to such a carrier Wa in a matrix (here, the configuration is not limited to a regularly arranged state, but widely includes a plurality of states arranged in both the row direction and the column direction) by using an adhesive to thereby configure the workpiece W. Additionally, the workpiece W is not limited to have the above-described material or configuration. For example, the carrier Wa may be round. As the size of the carrier Wa, a maximum width (one side or diameter) of about 400 mm to 700 mm and a thickness of about 0.2 mm to 3 mm may be used. In this embodiment, the carrier plate and the semiconductor chip are exemplified as the carrier Wa and the electronic component Wb, but various other configurations can be also used.

On the other hand, a mold resin R is, for example, a thermosetting resin (for example, an epoxy resin containing a filler) and its state may be granule-like, powder-like, liquid-like, gel-like, sheet-like, or solid-like typified by a mini-tablet in some cases.

Next, an outline of the resin molding apparatus 1 according to this embodiment will be described. As shown in FIG. 1, in the resin molding apparatus 1, a workpiece supply unit A, a resin supply unit B, a workpiece delivery unit C, a press unit D, and a cooling unit E are respectively connected in series to one another. The transportation of the workpiece W is performed by a workpiece transportation unit 2, a loader 4, and the like (this will be described in detail later). Additionally, the units may be arranged to surround a transportation robot at the center. Hereinafter, a case of a rectangular workpiece W will be described as an example.

The workpiece supply unit A is provided with a receiving position P (a first position) at which the workpiece W is received from the previous process. Further, the workpiece delivery unit C is provided with a delivery position Q (a second position) which is a position at which the workpiece W is delivered to the loader 4. Here, the workpiece transportation unit 2 is configured so that a transportation unit main body 2a is movable in a reciprocating manner between the receiving position P and the delivery position Q along a rail portion 3 provided among the workpiece supply unit A, the resin supply unit B, and the workpiece delivery unit C (see a solid arrow H in FIG. 1). As an example, the transportation unit main body 2a is connected to, for example, a drive belt (not shown) and moves in a reciprocating manner. Further, a holder plate 5 having a rectangular plate surface (which may be in a grid shape or the like) having a larger outer shape and a thicker thickness (for example, about 10 mm) than the workpiece W is provided on the transportation unit main body 2a. With the configuration of such a workpiece transportation unit 2, the workpiece W is positioned to the holder plate 5 and is transported in a placed state. Thus, even when the workpiece W thinner and larger than the conventional one is used, the workpiece is transported while being placed on the holder plate 5 and hence the bending of the workpiece W can be prevented.

Next, the resin supply unit B is provided with a dispenser 6 and a resin supply stage 7 which supplies the mold resin R (as an example, granular resin). The workpiece W can be transferred from the transportation unit main body 2a to the resin supply stage 7 by using a pick-and-place mechanism (not shown) movable in the Y-Z direction while being placed on the holder plate 5. The mold resin R is supplied from the dispenser 6 onto the workpiece W while being placed on the resin supply stage 7. Here, the dispenser 6 is provided to scan in the X-X direction on the workpiece W. Further, the resin supply stage 7 is provided with an electronic balance (not shown) and the mold resin R supplied onto the workpiece W is weighed so as to have an appropriate amount.

Next, the workpiece delivery unit C is provided with the delivery position Q which is a position at which the workpiece W having received the mold resin R is delivered from the holder plate 5 to the loader 4. The loader 4 is provided with a mechanism (to be described later in detail) which holds the workpiece W. With the configuration of such a loader 4, the workpiece W is held at the delivery position Q and is transported to the preheat unit 9 of the press unit D while the inside of the lower surface of the workpiece W is not supported. Additionally, the movement range of the loader 4 in the X-Y direction is indicated by dashed arrows G1 and G2 in FIG. 1.

Further, the workpiece delivery unit C is provided with a cleaning device 8 which removes dust such as resin powder or foreign matter attached to a predetermined surface of the workpiece W. The cleaning device 8 according to this embodiment is configured to clean the lower surface (here, a non-mounting surface of the electronic component Wb) when the workpiece W held by the loader 4 is transported from the delivery position Q to the press unit D (the preheat unit 9). As a modified example, the cleaning device 8 may be provided at a plurality of positions as indicated by the dashed line in FIG. 1.

Next, the press unit D is provided with a preheat unit 9 and a press unit 11. The preheat unit 9 is provided with a preheater 10. The preheater 10 is used to preheat (previously heat) the workpiece W having received the mold resin R to a predetermined temperature (as an example, about 100° C.) while being placed on the preheat stage 10a. The workpiece W which is preheated to a predetermined temperature by the preheat unit 9 (the preheater 10) is held by the loader 4 and is carried into the press unit 11 (the molding die 12).

The preheat unit 9 is provided with a pair of an X-direction reference block 10b and a Y-direction reference block 10c for correcting the positional displacement of the workpiece W in the rotation direction. Accordingly, it is possible to correct the positional displacement of the workpiece W in the rotation direction by pressing the workpiece W against the pair of the X-direction reference block 10b and the Y-direction reference block 10c with a pusher (not shown) or the like on the preheat stage 10a.

Here, the loader 4 is provided with a photographing camera 4a which reads coordinates of a corner portion of the workpiece W. Accordingly, it is possible to correct the position where the workpiece W is held by the loader 4. The reason why this correction is performed is because the position at which the loader 4 holds the workpiece W needs to be corrected before the workpiece is carried into the molding die 12 since any workpiece W has a dimensional tolerance of about 1 mm and the workpiece W is stretched when the workpiece W on the preheat stage 10a is preheated to a predetermined temperature.

As a specific correction method, the amount of displacement between the workpiece center position and the stage center position is detected from the amount of displacement between the external position of the workpiece W and the alignment mark. For example, the coordinates of the corner portion of the workpiece W is read by the photographing camera 4a provided in the loader 4, the displacement amount with respect to the alignment mark in the X-Y direction is calculated, the center position of the loader 4 is aligned with the center position of the workpiece W, and then the workpiece W is held. In this embodiment, one photographing camera 4a is provided in the loader 4, but the present invention is not limited thereto. A plurality of photographing cameras 4a may be provided to read the coordinates of the workpiece W.

On the other hand, the press unit 11 is provided with the molding die 12 including the upper die and the lower die. In this embodiment, the lower die is provided with a placement portion for the workpiece W and the upper die is provided with a cavity. After the workpiece W having the mold resin R mounted thereon is carried into the molding die 12 with such a configuration, the mold is closed and heated to, for example, about 130° C. to 150° C. to perform resin molding (compression molding). As an example, the lower die is of a movable type and the upper die is of a fixed type, but the present invention is not limited thereto. For example, the lower die may be of a fixed type, the upper die may be of a movable type, or both of them may be of a movable type. Further, the molding die 12 is opened and closed by a known mold opening and closing mechanism (not shown). As an example of the mold opening and closing mechanism, there is known a configuration including a pair of platens, a plurality of connection mechanisms (tie bars and pillars) provided with the pair of platens, a drive source (for example, an electric motor) moving (elevating) the platens, and a driving transmission mechanism (for example, toggle link) (all of them are not shown).

Further, the press unit 11 is provided with a film transportation mechanism 13 which supplies (transports) a release film F to the molding die 12 (here, the upper die). Since this film transportation mechanism 13 is provided, the release film F is adsorbed and held on an upper die clamp surface with a cavity. Here, the release film F is made of a long continuous film material having excellent heat resistance, ease of peeling, flexibility, and extensibility and for example, polytetrafluoroethylene (PTFE), polytetrafluoroethylene polymer (ETFE), PET, FEP, fluorine-impregnated glass cloth, polypropylene, polyvinylidene chloride, and the like are preferably used. The release film F is fed from a feeding roll F1 and is supplied (transported) to be wound on a winding roll F2 through the upper die clamp surface. Instead of the long film, a strip-shaped film cut into a required size corresponding to the workpiece W may be used.

Next, the cooling unit E is provided with a cooling stage 14 which cools the workpiece W taken out from the molding die 12. As an operation example, in a state in which the resin-molding operation is completed and the molding die 12 is opened, the loader 4 enters the molding die 12 and takes out the workpiece W in a held state. The workpiece W is transported from the press unit D to the cooling unit E while being held by the loader 4 and is delivered to the cooling stage 14 to be cooled. Additionally, the cooled workpiece W is transported to the next process (dicing process or the like).

Next, a configuration of the characteristic loader 4 in this embodiment will be described in detail.

Figure 2:
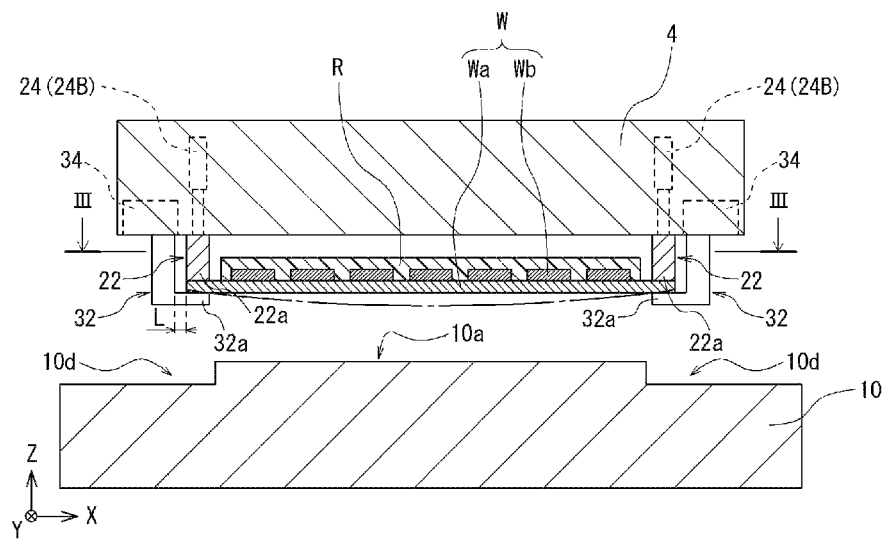
FIG. 2 is a schematic view (front cross-sectional view) showing an example of a loader and a preheater of the resin molding apparatus of FIG. 1.

The loader 4 includes, as shown in FIG. 2, a frame body 22 which comes into contact with and separates from an outer edge portion of an upper surface of the workpiece W (here, the mounting surface of the electronic component Wb) and a first moving device 24 which moves the frame body 22 up and down. Further, the loader 4 includes a chuck 32 which comes into contact with and separates from an outer edge portion of a lower surface of the workpiece W (here, a non-mounting surface of the electronic component Wb) and a second moving device 34 which moves the chuck 32. The workpiece W can be sandwiched between the frame body 22 and the chuck 32 in the vertical direction (Z-axis direction). That is, the frame body 22 and the chuck 32 can be disposed to overlap each other in the plan view. Additionally, a control unit (not shown) which controls the movement of the loader 4, the first moving device 24, and the second moving device 34 is provided at a predetermined position of the resin molding apparatus 1.

The first moving device 24 according to this embodiment includes a guide post 24A which guides the frame body 22 to move up and down (in the Z-axis direction) and a cylinder 24B which is a drive mechanism for driving the frame body 22 to move up and down (in the Z-axis direction). Here, the cylinder 24B is operated while being connected to an electro-pneumatic regulator (not shown) controlled by the control unit. Further, the frame body 22 may be moved up and down by the combination of a servo motor, a linear guide, and the like. Accordingly, the operation (the pressing force, the pressing speed, or the like) of the cylinder 24B can be variably controlled.

Figure 3:
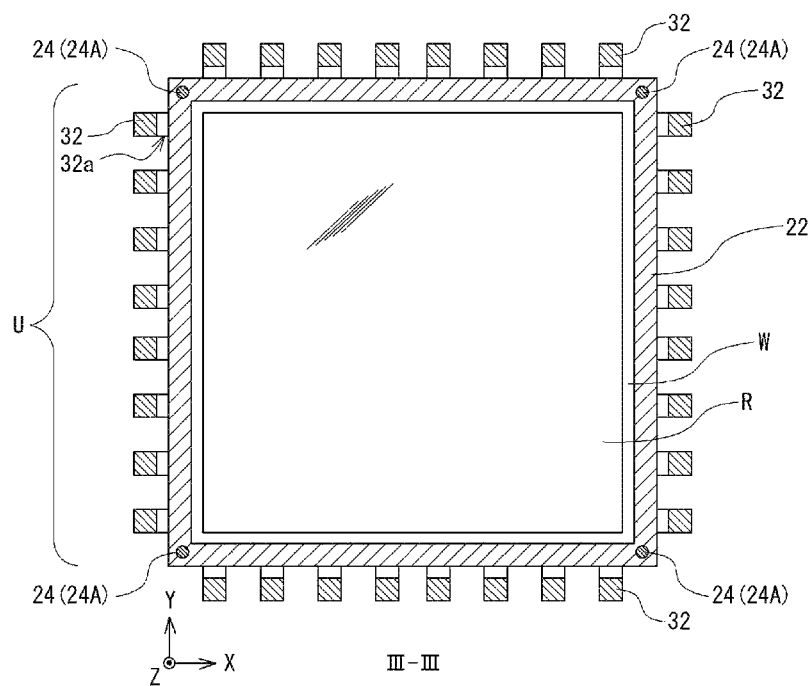
FIG. 3 is a cross-sectional view taken along a line III-III of FIG. 2.
Figure 4:
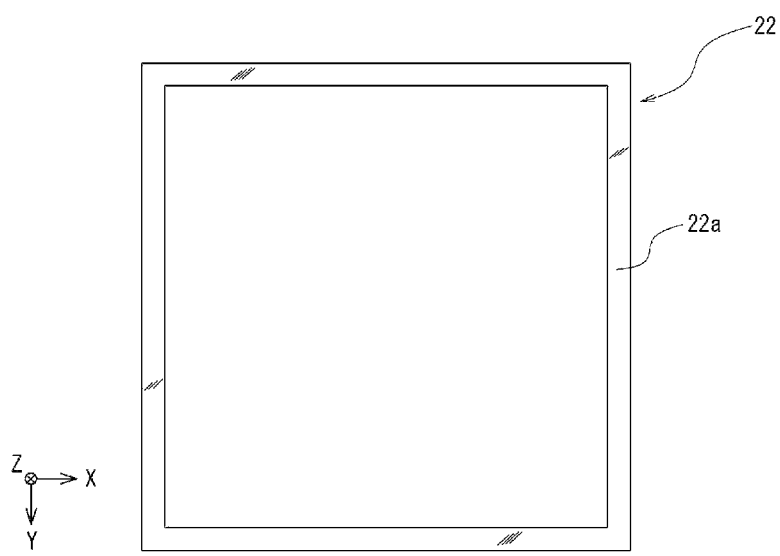
FIG. 4 is a schematic view (bottom view) showing an example of a frame body of the resin molding apparatus of FIG. 1.

Next, the frame body 22 according to this embodiment includes a contact portion 22a which is provided over the entire circumference of the outer edge portion of the workpiece W. As an example of the contact portion 22a, as shown in FIGS. 2 to 4, the contact portion 22a is formed in a continuous annular shape (a square annular shape corresponding to the rectangular workpiece W) in the plan view (in the bottom view). However, the contact portion 22a is not limited to this shape and may be formed in a discontinuous shape (intermittent shape). Additionally, in FIG. 2, the chuck on the back side is not shown in order to make the configuration easy to understand.

Further, at least the contact portion 22a of the frame body 22 is preferably made of an ESD (Electrostatic Discharge) material having a heat resistant temperature of about 250° C. This ESD material releases, prevents, or alleviates the charged state generated by peel charging or triboelectric charging with another member (for example, carrier Wa) with which the frame body 22 comes into contact. Accordingly, it is possible to prevent the generation of static electricity in the frame body 22 and prevent the mold resin R placed on the workpiece W from attaching to the frame body 22. For this reason, the frame body 22 in the inner peripheral surface and the lower surface can be made of the ESD material.

According to the above-described configuration, the workpiece W can be transported while the outer edge portion of the workpiece W is sandwiched between the frame body 22 and the chuck 32 when transporting the workpiece W from the delivery position Q onto the preheater 10 and when transporting the workpiece W from the preheater 10 into the molding die 12. Thus, even when the workpiece W thinner and larger than the conventional one is used, the workpiece W is transported while the outer edge portion is sandwiched. Accordingly, it is possible to suppress the bending of the workpiece W due to the weight of the mold resin R or the own weight. As a result, it is possible to prevent the occurrence of molding defects caused when the mold resin R is biased due to the bending.

Here, the control unit performs the following control. Specifically, the frame body 22 is controlled to be in contact with the upper surface of the workpiece W while the loader 4 moves the workpiece W having received the mold resin R from the delivery position Q onto the preheat stage 10a.

According to the above-described configuration, since the contact portion 22a of the frame body 22 has a continuous annular shape in the plan view (the bottom view), it is possible to obtain the action of preventing the atmosphere from passing on the moving workpiece W when the workpiece W in which the mold resin R is supplied to the upper surface (here, the mounting surface of the electronic component Wb) by the dispenser 6 is transported by using the loader 4. Accordingly, since it is possible to prevent the mold resin R from flying up, it is possible to prevent the generation of particle (dust) floating in the resin molding apparatus 1. Thus, it is possible to prevent the occurrence of molding defects caused by particle.

Further, the control unit performs the following control. Specifically, a pressing force and a pressing speed when the frame body 22 contacts the workpiece W on the preheat stage 10a are controlled (additionally, any one of them can be controlled).

As described above, the thin and large workpiece W is likely to bend and the lower surface of the workpiece W (carrier Wa) is bent so that the inside protrudes downward as indicated by the one-dotted chain line in FIG. 2. If the workpiece W is suddenly pressed to correct the bending when preheating the bent workpiece W on the preheat stage 10a, there is a probability that the workpiece W is damaged (broken). On the other hand, since heating efficiency becomes poor due to the region not contacting the preheat stage 10a (the upper surface which is a heating surface), the heating time is extended. Further, since a non-uniform heated state occurs due to the regions contacting and not contacting the preheat stage 10a (the upper surface which is a heating surface), molding defects occur.

Figure 5:
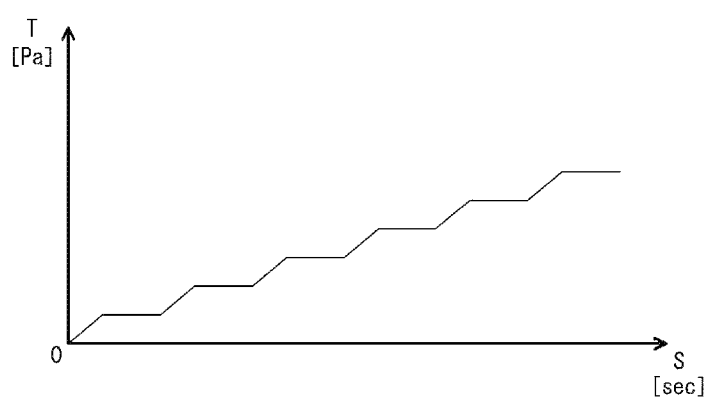
FIG. 5 is an explanatory diagram of a control method in frame body operation control of the resin molding apparatus of FIG. 1.

For such problems, according to the above-described configuration, it is possible to perform the control that applies a predetermined pressing force T [Pa] in accordance with an elapse time S [sec] by bringing the frame body 22 into contact with the workpiece W (the outer edge portion) when preheating the workpiece W transported and placed on the preheater 10 (the preheat stage 10a). An example of control is shown in FIG. 5. Accordingly, it is possible to correct the upward bending of the outer edge portion while preventing the damage (breakage) of the workpiece W. Thus, since the non-uniform heated state is solved, it is possible to improve heating efficiency and prevent the occurrence of molding defects. Further, when the pressing speed is also appropriately set, it is possible to shorten the preheating time and improve the production efficiency. Additionally, even when the workpiece W is transported and placed in the molding die 12 (on the lower die), the workpiece W (the outer edge portion) may be pressed by the frame body 22 in the same way.

Next, the chuck 32 according to this embodiment has a configuration in which the chucks 32 are annually arranged in the plan view and support the outer edge portion of the workpiece W in a contact state at a plurality of points arranged at constant intervals in the direction along the side of the workpiece W. Specifically, eight-point (eight) supporting chuck claws 32a are provided at equal intervals for each side to correspond to the rectangular workpiece W. For example, when the workpiece W is supported at two points for each side as the minimum number when stably holding the workpiece W on two sides, the bending of the workpiece W occurs between the support points and hence a problem arises in that the mold resin R on the workpiece W falls out. In contrast, according to the above-described configuration, it is possible to prevent the workpiece W from bending between the support points. As an example, the width dimension of the chuck claw 32a in the plan view is set to about 20 mm.

Further, the chuck 32 according to this embodiment has a configuration in which a plurality of chuck claws 32a provided at one side (as an example, the side U in FIG. 3) are integrated on the rear end side (the side opposite to the side facing the workpiece W). Accordingly, the chuck claw 32a can integrally enter and retract from a projection plane in the plan view of the workpiece W. Thus, a mechanism for moving the chuck claw 32a (the second moving device 34 to be described later) can be simplified.

Here, the second moving device 34 according to this embodiment is configured to take a position in which the chuck 32 (here, the chuck claw 32a) is in the projection plane in the plan view of the workpiece W and is close to the outer peripheral portion of the workpiece W not to contact the side with a predetermined gap (in FIG. 2, L=about 1.7 mm) and a position in which the chuck 32 is out of the projection plane in the plan view of the workpiece W. Specifically, a driving mechanism (for example, a cylinder or the like) for driving the chuck claw 32a to move horizontally (in the X-Y direction) is provided (not shown). However, the present invention is not limited to this configuration and a configuration including a rotation shaft (not shown) for rotating the chuck claw 32a or a configuration realizing the movement of a combination of horizontal movement and rotational movement is considered.

In this way, the workpiece W placed on the delivery position Q and the preheater 10 can be held by the loader 4 by the configuration in which the chuck 32 (the chuck claw 32a) is movable. Further, the position where the loader 4 holds the workpiece W can be corrected by the configuration in which the chuck 32 (the chuck claw 32a) moves close to the outer peripheral portion of the workpiece W not to contact therewith.

When the workpiece W (the carrier Wa) which is bent so that the inside protrudes downward as indicated by the one-dotted chain line in FIG. 2 is placed on the preheat stage 10a by using the configuration having such a chuck claw 32a, it is considered to perform the following operations as a process of efficiently placing the workpiece W while correcting the bending and preventing the sudden pressing. The loader 4 is transported onto the preheater 10 (the preheat stage 10a) and the entire loader 4 is lowered. When preheating the placed workpiece W, the frame body 22 is brought into contact with the workpiece W (the outer edge portion) and the inside of the lower surface of the carrier Wa is brought into contact with the preheat stage 10a.

Here, if the carrier Wa is pressed down by the loader 4 as it is, a fine control operation cannot be performed and hence the carrier Wa is damaged. Here, the chuck claw 32a is first moved by the second moving device 34 and is retracted from the lower surface of the carrier Wa. Next, the frame body 22 is lowered. Specifically, as shown in FIG. 5, it is possible to perform the control of applying a predetermined pressing force T [Pa] in accordance with an elapse time S [sec]. Accordingly, it is possible to perform the control so that the heating of the workpiece W is prioritized to heat the workpiece W to a certain extent while the workpiece W is pressed at a low pressure in the beginning and the correction of the workpiece W (the flattening operation) is prioritized while increasing the pressure. Accordingly, the above-described effect of the present invention can be obtained.

Additionally, as operation control for placing the workpiece W, a pressing speed may be controlled instead of a pressing force or both of them may be controlled. Further, in such control, as shown in FIG. 5, these may be increased in a stepwise manner, may be increased linearly, or may be increased quadratically while maintaining them for a predetermined time. In addition, a speed of increasing the pressing force or the pressing speed may be increased or decreased in accordance with an elapse time.

Additionally, as described above, the workpiece W is transported while the outer edge portion of the workpiece W is sandwiched between the frame body 22 and the chuck 32 when transporting the workpiece W from the delivery position Q onto the preheater 10 and when transporting the workpiece W from the preheater 10 into the molding die 12 (here, on the lower die). For that reason, a retraction groove 10d which allows the chuck 32 (the chuck claw 32a) to enter the retraction groove 10d and retract therein while the lower surface of the workpiece W (here, the non-mounting surface of the electronic component Wb) comes into contact with a predetermined placement surface is provided at a corresponding position (a position right below the chuck claw 32a in the plan view) of the preheat stage 10a and the molding die 12 (the lower die). Accordingly, the workpiece W can be placed while contacting the preheat stage 10a and the molding die 12 (the lower die).

Further, as described above, the outer diameter dimension of the workpiece W to be subjected to resin molding is not one type. For that reason, the frame body 22 and the chuck 32 are prepared as a plurality of types of assemblies corresponding to a plurality of types of workpiece W having different outer diameter dimensions. Further, the loader 4 is configured to be operated while being attachable to and detachable from each assembly. Accordingly, it is possible to perform resin molding on the plurality of types of workpiece W having different outer diameter dimensions with one resin molding apparatus according to the present invention.

As described above, according to the resin molding apparatus of the present invention, it is possible to correct the bending of the workpiece during preheating or the like. Thus, it is possible to improve production efficiency and prevent the occurrence of molding defects.

Additionally, the present invention is not limited to the above described embodiment and can be modified into various forms within the scope not departing from the present invention. In particular, a workpiece having a configuration in which a plurality of semiconductor chips are mounted in a matrix on a rectangular carrier has been described, but the present invention is not limited thereto. For example, also in a workpiece in which other members or the like are used instead of a carrier to mount components thereon or a workpiece in which other elements or the like are used instead of semiconductor chips to be mounted, resin molding can be performed in the same way. Although the workpiece is more likely to bend as it becomes larger, it is not necessary to use a workpiece in which one side is large to be 500 mm. In an extremely thin substrate, the configuration of the present invention can be applied to a workpiece smaller than that.

Further, a compression molding type resin molding apparatus having a cavity in an upper die has been described as an example, but the present invention can be also applied to a configuration in which a cavity is provided only in a lower die or a transfer molding type.

A resin molding apparatus according to the present invention includes: a molding die which performs resin molding of a workpiece having an electronic component mounted inside a carrier; and a loader which transports the workpiece, wherein the loader includes a frame body which comes into contact with and separates from an outer edge portion of an upper surface of the workpiece, a moving device which moves the frame body up and down, and a chuck claw which comes into contact with an outer edge portion of a lower surface of the workpiece, and wherein the frame body includes a contact portion which is provided over the entire circumference of the outer edge portion in the upper surface of the workpiece.

Accordingly, it is possible to correct the bending of the workpiece. Thus, the workpiece can be made to have a uniform heated state when preheating and the occurrence of molding defects can be prevented. Further, the efficiency of heating the workpiece can be improved and the heating time can be shortened, that is, the production efficiency can be improved.

Further, the resin molding apparatus preferably further includes a control unit which controls the movement of the moving device and the control unit preferably controls at least one of a pressing force and a pressing speed when the frame body contacts the workpiece. If the pressing force is optimally controlled, it is possible to correct the bending while preventing the workpiece from being damaged (broken). On the other hand, if the pressing speed is optimally controlled, it is possible to improve production efficiency by shortening the processing time.

Further, the contact portion is preferably formed in a continuous annular shape in a plan view. Further, the resin molding apparatus preferably further includes a preheat stage which preheats the workpiece and the control unit preferably controls the frame body such that it comes into contact with the workpiece while the loader moves the workpiece from a predetermined position onto the preheat stage. Accordingly, when the workpiece is transported by using the loader, an action of preventing any airflow due to this transportation entering the workpiece can be obtained and the molding resin can be prevented from becoming airborne.

Further, the resin molding apparatus preferably further includes a dispenser which supplies a mold resin onto the workpiece and the control unit preferably controls the frame body and the chuck claw such that the workpiece is sandwiched while the loader moves the workpiece having received the mold resin from the dispenser from a predetermined position onto the preheat stage. Accordingly, since the outer edge portion is sandwiched and transported even when a workpiece thinner and larger than the conventional one is used, it is possible to prevent bending of the workpiece.

Further, the chuck claw is preferably configured to be retractable in such a manner that the chuck claw moves from a position in which the workpiece is within a projection plane in a plan view to a position in which the workpiece is outside of the projection plane in the plan view when the frame body presses the workpiece in both of a state in which the workpiece is placed on the molding die and a state in which the workpiece is placed on the preheat stage. Accordingly, the workpiece can be placed on the preheat stage and the molding die in a contact state.

Further, the control unit preferably controls at least one of a pressing force and a pressing speed when the frame body presses the workpiece while the workpiece is placed on the molding die. Further, the control unit preferably controls at least one of a pressing force and a pressing speed when the frame body presses the workpiece while the workpiece is placed on the preheat stage. If the pressing force is optimally controlled, it is possible to correct the bending while preventing the workpiece from being damaged (broken). On the other hand, if the pressing speed is optimally controlled, it is possible to improve production efficiency by shortening the processing time.

Further, at least the contact portion of the frame body is preferably formed by using an ESD material. Accordingly, it is possible to prevent the generation of static electricity in the frame body and prevent the mold resin placed on the workpiece from being adsorbed on the frame body.

Further, the moving device preferably includes a guide post which guides the frame body to move up and down and a cylinder which drives the frame body to move up and down. Accordingly, it is possible to adjust the pressing force or the pressing speed of the frame body by the control of the cylinder while allowing the frame body to be movable up and down.

As an example, the carrier is formed in a shape having a thickness of 0.2 mm to 3 mm and a maximum width of 400 mm to 700 mm. As described above, the present invention has a particularly significant effect on a workpiece having a carrier thinner and larger than a conventional one.

According to the present invention, it is possible to correct the bending of the workpiece during preheating or the like. Thus, it is possible to improve production efficiency and prevent the occurrence of molding defects.

It will be apparent to those skilled in the art that various modifications and variations can be made to the disclosed embodiments without departing from the scope or spirit of the present invention. In view of the foregoing, it is intended that the present invention covers modifications and variations provided that they fall within the scope of the following claims and their equivalents.

What is claimed is:

1. A resin molding apparatus comprising: a molding die which performs resin molding of a workpiece having an electronic component mounted inside a carrier; and a loader which transports the workpiece, wherein the loader comprises a frame body which comes into contact with and separates from an outer edge portion of an upper surface of the workpiece, a moving device which moves the frame body up and down, and a plurality of chuck claws arranged on each side of the loader in the plan view, said chuck claws supporting the outer edge portion of the workpiece in a contact state by the plurality of chuck claws which are provided at equal intervals for the each side of the loader to correspond to the workpiece and come into contact with an outer edge portion of a lower surface of the workpiece, and wherein the frame body comprises a contact portion which is provided over the entire circumference of the outer edge portion in the upper surface of the workpiece, the contact portion is formed in a continuous annular shape in the plan view, the plurality of chuck claws provided at one side are integrated, and the chuck claws move in a position in which the chuck claws are within a projection plane in the plan view of the workpiece and are close to the outer peripheral portion of the workpiece not to contact the side with a predetermined gap and a position in which the chuck claws are out of the projection plane in the plan view of the workpiece.

2. The resin molding apparatus according to claim 1, further comprising:
a control unit configured to control the movement of the moving device,
wherein the control unit controls at least one of a pressing force and a pressing speed when the frame body contacts the workpiece.

3. The resin molding apparatus according to claim 2, further comprising:
a preheat stage which preheats the workpiece,
wherein the control unit controls the frame body to come into contact with the workpiece while the loader moves the workpiece from a predetermined position onto the preheat stage.

4. The resin molding apparatus according to claim 3, further comprising:
a dispenser which supplies a mold resin onto the workpiece,
wherein the control unit controls the frame body and the chuck claw to sandwich the workpiece while the loader moves the workpiece having received the mold resin from the dispenser from a predetermined position onto the preheat stage.

5. The resin molding apparatus according to claim 3, wherein the chuck claw is configured to be retractable in such a manner that the chuck claw moves from a position in which the workpiece is within a projection plane in the plan view to a position in which the workpiece is out of the projection plane in the plan view when the frame body presses the workpiece in both of a state in which the workpiece is placed on the molding die and a state in which the workpiece is placed on the preheat stage.

6. The resin molding apparatus according to claim 5, wherein the control unit controls at least one of a pressing force and a pressing speed when the frame body presses the workpiece while the workpiece is placed on the molding die.

7. The resin molding apparatus according to claim 5, wherein the control unit controls at least one of a pressing force and a pressing speed when the frame body presses the workpiece while the workpiece is placed on the preheat stage.

8. The resin molding apparatus according to claim 1, wherein at least the contact portion of the frame body is formed by using an electrostatic discharge material.

9. The resin molding apparatus according to claim 1, wherein the moving device comprises a guide post which guides the frame body to move up and down and a cylinder which drives the frame body to move up and down.

* * * * *